US011038011B2

(12) United States Patent
Cheng et al.

(10) Patent No.: US 11,038,011 B2
(45) Date of Patent: Jun. 15, 2021

(54) METAL-INSULATOR-METAL CAPACITORS INCLUDING NANOFIBERS

(71) Applicant: GLOBALFOUNDRIES U.S. Inc., Santa Clara, CA (US)

(72) Inventors: Lili Cheng, Rexford, NY (US); Robert J. Fox, III, Greenfield Center, NY (US); Luke England, Lakeway, TX (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/667,037

(22) Filed: Oct. 29, 2019

(65) Prior Publication Data

US 2021/0126086 A1    Apr. 29, 2021

(51) Int. Cl.
| H01L 21/337 | (2006.01) |
| H01L 29/66 | (2006.01) |
| H01L 49/02 | (2006.01) |
| H01L 51/50 | (2006.01) |
| H01L 51/42 | (2006.01) |

(52) U.S. Cl.
CPC .......... *H01L 28/84* (2013.01); *H01L 51/4266* (2013.01); *H01L 51/502* (2013.01)

(58) Field of Classification Search
CPC .................. H01L 51/4266; H01L 51/502
USPC ................... 257/343; 438/157, 176, 195
See application file for complete search history.

(56) References Cited

U.S. PATENT DOCUMENTS

| 9,583,557 | B2 | 2/2017 | Cheng et al. |
| 9,702,821 | B2 * | 7/2017 | Zhou ................... G01N 21/6428 |
| 10,433,542 | B2 * | 10/2019 | Xu .......................... A01N 25/10 |
| 10,569,506 | B2 * | 2/2020 | Jin ........................... B05D 5/00 |
| 10,741,485 | B2 * | 8/2020 | Kabir ..................... H01L 23/147 |
| 2012/0092660 | A1 * | 4/2012 | Wu ...................... G01N 21/658 |
|  |  |  | 356/301 |
| 2019/0148072 | A1 | 5/2019 | Fox, III et al. |

FOREIGN PATENT DOCUMENTS

| WO | 2005094440 A2 | 10/2001 |
| WO | 2008040706 A1 | 4/2008 |

OTHER PUBLICATIONS

Saleem et al., "Integrated on-chip solid state capacitor based on vertically aligned carbon nanofibers, grown using a CMOS temperature compatible process", Solid-State Electronics vol. 139, Jan. 2018, pp. 75-79.
S. Cremer et al., "High Performances 3D Damascene MIM Capacitors Integrated in Copper Back-End Technologies," 2006 Bipolar/BiCMOS Circuits and Technology Meeting, Maastricht, 2006, pp. 1-4.

* cited by examiner

*Primary Examiner* — Calvin Lee
(74) *Attorney, Agent, or Firm* — Thompson Hine LLP; Anthony Canale

(57) ABSTRACT

Methods of fabricating a structure for a metal-insulator-metal (MIM) capacitor. Conductive nanofibers are formed on a surface of a conductor layer. Each conductive nanofiber is terminated by an enlarged tip portion opposite the surface of the conductor layer. The enlarged tip portion is removed from each conductive nanofiber. The MIM capacitor may include the conductive nanofibers as portions of an electrode.

20 Claims, 5 Drawing Sheets

METAL-INSULATOR-METAL CAPACITORS INCLUDING NANOFIBERS

BACKGROUND

The invention relates generally to integrated circuits and semiconductor device fabrication and, in particular, to methods of fabricating a structure for a metal-insulator-metal (MIM) capacitor.

On-chip passive elements, such as MIM capacitors, are deployed in many types of integrated circuits, such as radiofrequency integrated circuits. A MIM capacitor may be integrated into one or more of the metallization levels of a back-end-of-line (BEOL) interconnect structure using materials that are commonly available in copper BEOL technologies. A two-electrode MIM capacitor includes top and bottom planar electrodes and a planar capacitor dielectric disposed between the top and bottom planar electrodes as an electrical insulator. The capacitance, or amount of charge held by the MIM capacitor per unit of applied voltage, depends among other factors on the area of the top and bottom electrodes, their separation, and the dielectric constant of the material constituting the capacitor dielectric.

Improved methods of fabricating a structure for a metal-insulator-metal (MIM) capacitor are needed.

SUMMARY

In an embodiment of the invention, a method includes forming a plurality of conductive nanofibers on a surface of a conductor layer. Each conductive nanofiber is terminated by an enlarged tip portion opposite the surface of the conductor layer. The method further includes removing the enlarged tip portion from each of the plurality of conductive nanofibers.

In an embodiment of the invention, a method includes forming a plurality of conductive nanofibers on a surface of a first conductor layer. Each of the plurality of conductive nanofibers is terminated by an enlarged tip portion opposite the surface of the first conductor layer. The method further includes removing the enlarged tip portion from each of the plurality of conductive nanofibers, depositing a conformal dielectric layer on the first conductor layer and the plurality of conductive nanofibers after the enlarged tip portion is removed from each of the plurality of conductive nanofibers, and depositing a second conductor layer over the conformal dielectric layer on the first conductor layer and the plurality of conductive nanofibers.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
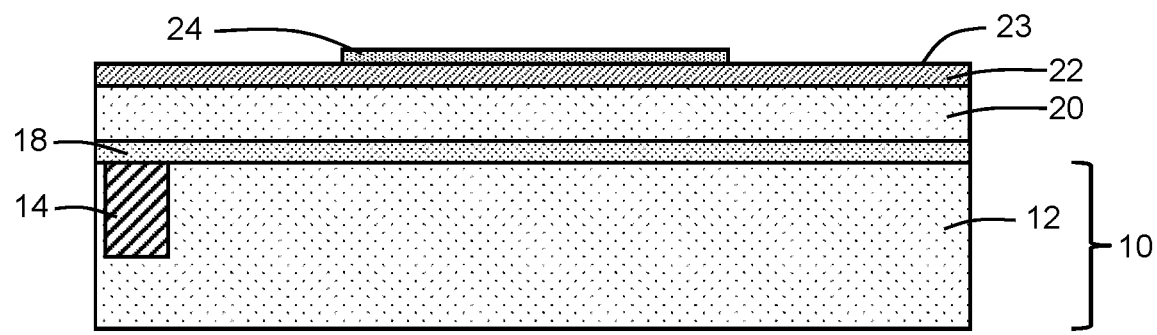
FIGS. 1-5 are cross-sectional views of a structure at successive fabrication stages of a processing method for fabricating a MIM capacitor in accordance with embodiments of the invention.

With reference to FIG. 1 and in accordance with embodiments of the invention, a back-end-of-line (BEOL) interconnect structure includes an interlayer dielectric layer 12 of a routing or metallization level 10, a wiring feature 14 embedded in the interlayer dielectric layer 12, and a capping layer 18 on the interlayer dielectric layer 12 and wiring feature 14. Additional metallization levels (not shown) may exist beneath the metallization level 10 such that the metallization level 10 is one of the upper metallization levels in the BEOL interconnect structure. The interlayer dielectric layer 12 may be composed of an electrical insulator, such as silicon dioxide or a low-k dielectric material. The capping layer 18 may be composed of a nitride-based dielectric material, such as silicon nitride, or a low-k nitride-based dielectric material. The wiring feature 14 of the metallization level 10, which may have a top surface that is coplanar with the top surface of the interlayer dielectric layer 12, may be composed of a metal such as copper or cobalt, with additional liner and barrier layers (e.g., tantalum nitride or titanium nitride) also present. The BEOL interconnect structure is carried on a die or chip (not shown) representing a section of a wafer that has been processed by front-end-of-line (FEOL) processes, such as a complementary metal-oxide-semiconductor (CMOS) process, to fabricate one or more integrated circuits containing device structures. Conductive features in the different metallization levels of the BEOL interconnect structure function to interconnect the device structures and may also provide circuit-to-circuit connections or establish contacts with input and output terminals.

A dielectric layer 20 is deposited with a given thickness over the metallization level 10 and on the capping layer 18 covering the metallization level 10. In an embodiment, the dielectric layer 20 may be composed of an electrical insulator, such as silicon dioxide or a low-k dielectric material, deposited by chemical vapor deposition or atomic layer deposition.

A conductor layer 22 is deposited on a top surface of the dielectric layer 20. The conductor layer 22 may be composed of one or more conductive materials (i.e., conductors or metals), such as titanium nitride, tantalum nitride, tantalum, aluminum, or a layered combination of these conductive materials. The conductive material of conductor layer 22 may be deposited by, for example, physical vapor deposition or chemical vapor deposition.

A catalyst layer 24 is formed on a top surface 23 of the conductor layer 22 and patterned with lithography and etching processes to cover a given area on the top surface of the conductor layer 22. The catalyst layer 24 may be composed of a metal, such as cobalt, aluminum, tungsten, nickel, platinum, iron, or copper, that supports the growth of nanofibers.

Figure 2:
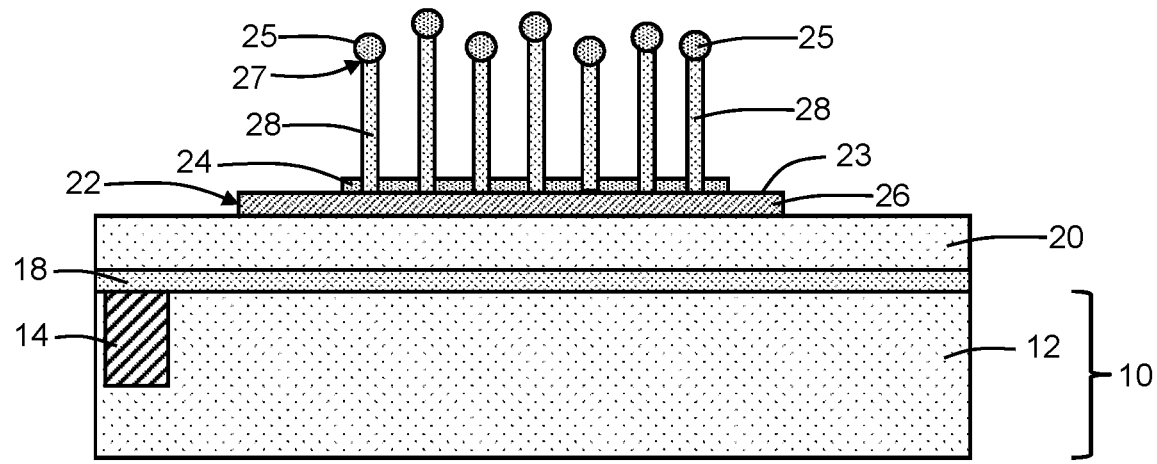

With reference to FIG. 2 in which like reference numerals refer to like features in FIG. 1 and at a subsequent fabrication stage, the conductor layer 22 (FIG. 1) is patterned with lithography and etching processes to form a plate or electrode 26 of a metal-insulator-metal (MIM) capacitor. The lithography process may entail forming an etch mask that covers the catalyst layer over a section of conductor layer 22. The etching process may entail a reactive ion etching process that removes the material of conductor layer 22 from areas that are not masked by the etch mask. In that regard, the catalyst layer 24 and a section of the conductor layer 22 beneath the catalyst layer 24 are specifically masked during the etching process by the etch mask.

Nanofibers 28 may be synthesized or grown from the catalyst layer 24. Each of the nanofibers 28 projects upwardly away from the top surface 23 of the conductor layer 22 to an enlarged tip portion 27. Each enlarged tip portion 27 is remote from the top surface 23. The tip portions 27 of the nanofibers 28 include respective sections 25 of the material of the catalyst layer 24 that are lifted and displaced upward from the catalyst layer 24 during growth. Due to the lifting and removal of the sections 25, one end of each nanofiber 28 may be in direct contact with the conductor layer 22 providing the electrode 26. The tip portion 27 of each nanofiber 28 is effectively enlarged by its appended section 25 in that, from a perspective normal to the electrode 26, the cross-sectional area of each tip portion 27 is greater than the cross-sectional area of the nanofiber 28 between the tip portion 27 and the electrode 26. In an embodiment, the nanofibers 28 may be low profile nanofibers with a length of less than or equal to five (5) microns, which may be particular susceptible to the occurrence of the enlarged tip portions 27.

The nanofibers 28 may have a diameter in a range of 5 nanometers to 50 nanometers, and the tip portions 27 have a larger diameter than the nanofibers 28. The nanofibers 28 may be composed of an electrical conductor. In an embodiment, the nanofibers 28 may be composed of carbon. In an alternative embodiment, the nanofibers 28 may be composed of graphene. The nanofibers 28 may be grown by chemical vapor deposition using a reactant in the form of a gas or vapor that contains a source material (e.g., a carbon-containing gas such as acetylene or ethylene) for the growth.

Figure 3:
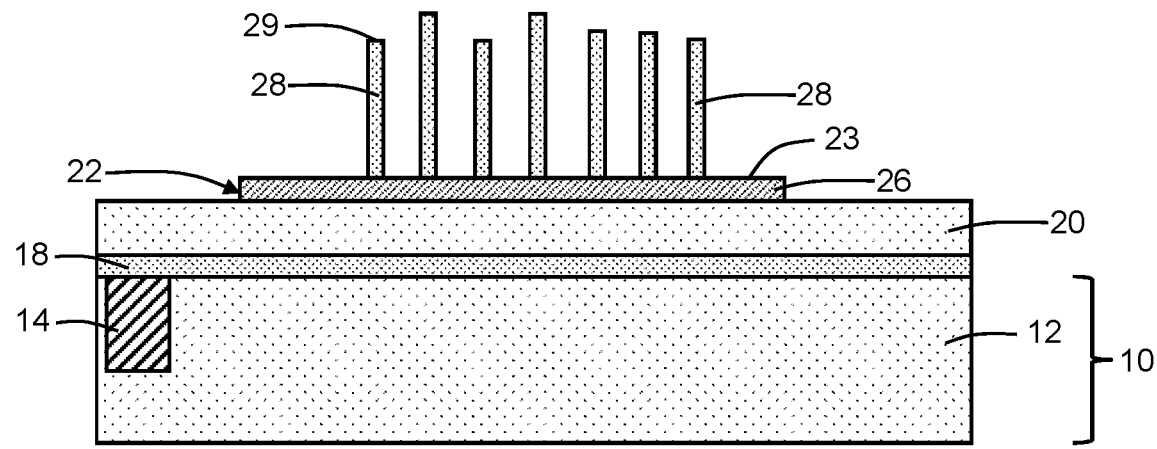

With reference to FIG. 3 in which like reference numerals refer to like features in FIG. 2 and at a subsequent fabrication stage, the catalyst layer 24 and the sections 25 of the catalyst layer 24 may be removed. For example, the catalyst layer 24 may be removed by etching with a wet chemical etching process using a diluted acid, followed by a rinse with deionized water. The nanofibers 28 and the conductor layer 22 are unaffected by the wet chemical etching process removing the catalyst layer 24. The removal of the sections 25 of the catalyst layer 24 exposes terminating ends 29 of the nanofibers 28. The terminating end 29 of each nanofiber 28 is opposite from an end that is in direct contact with the top surface 23 of the conductor layer 22.

Figure 4:
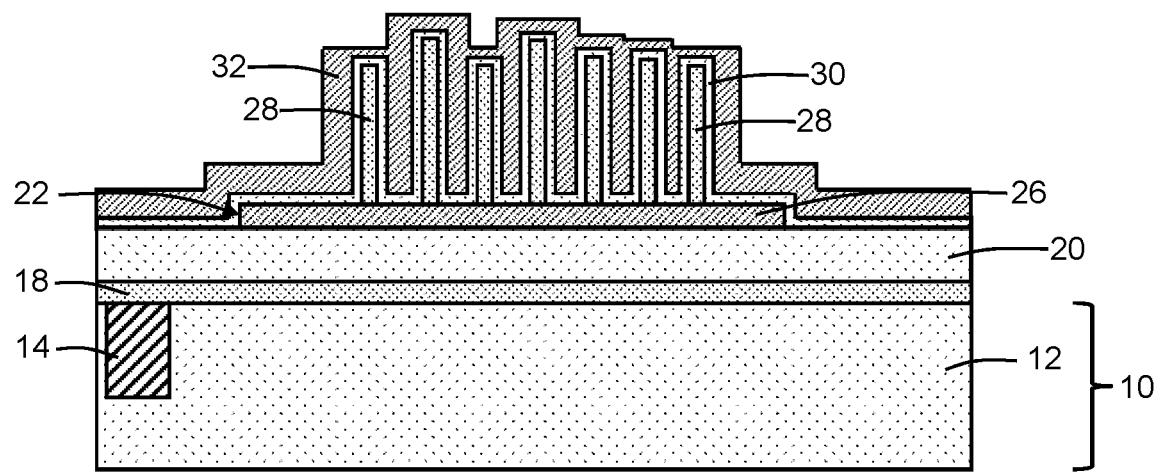

With reference to FIG. 4 in which like reference numerals refer to like features in FIG. 3 and at a subsequent fabrication stage, a dielectric layer 30 is deposited over the dielectric layer 20, electrode 26, and the nanofibers 28. The dielectric layer 30 may be composed of a dielectric material, such as a high-k dielectric material having a dielectric constant (i.e., permittivity) greater than the dielectric constant of silicon dioxide. Suitable high-k dielectric materials for dielectric layer 30 include, but are not limited to, hafnium oxide, doped hafnium oxide, zirconium oxide, doped zirconium oxide, tantalum oxide, or aluminum oxide. The dielectric layer 30 may be conformally deposited by atomic layer deposition. The dielectric layer 30 may conform to the topography of the dielectric layer 20, electrode 26, and the nanofibers 28 with a substantially uniform thickness.

A conductor layer 32 is deposited over the dielectric layer 30 on the dielectric layer 20, electrode 26, and the nanofibers 28. The conductor layer 32 may be composed of one or more conductive materials (i.e., conductors or metals), such as titanium nitride, tantalum nitride, tantalum, titanium, tungsten, tungsten nitride, a layered stack of these conductive materials (e.g., a bilayer of titanium and titanium nitride), or another combination of these conductive materials. The conductive material of conductor layer 32 may be deposited by, for example, a deposition process combination of atomic layer deposition followed by physical vapor deposition. In an embodiment, the conductor layer 32 may be composed of the same conductor as the conductor layer 22. Portions of the conductor layer 32 may fill the spaces or gaps between the nanofibers 28 to provide a solid composite layer with a top surface that varies in height due to the different lengths of the nanofibers 28 resulting from the growth process.

The removal of the sections 25 of the material of the catalyst layer 24 from the nanofibers 28, before the dielectric layer 30 and conductor layer 32 are deposited, promotes filling of the gaps between the nanofibers 28 by the dielectric layer 30 and conductor layer 32. If the sections 25 of the material of the catalyst layer 24 were not removed, then the gap fill by the dielectric layer 30 and conductor layer 32 may be incomplete and result in the incorporation of air gaps in the gaps between the nanofibers 28.

Figure 5:
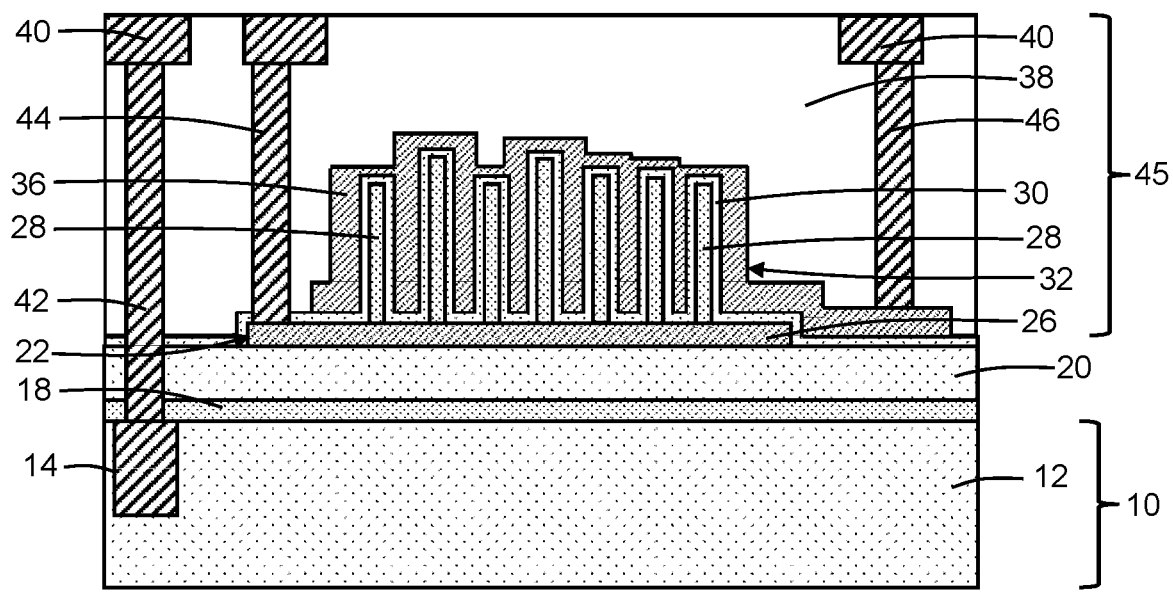

With reference to FIG. 5 in which like reference numerals refer to like features in FIG. 4 and at a subsequent fabrication stage, the conductor layer 32 is patterned with lithography and etching processes to form a plate or electrode 36 of the metal-insulator-metal capacitor. The lithography process may form an etch mask that covers the catalyst layer over a section of conductor layer 32 covering the nanofibers 28. The etching process may be a reactive ion etching process that removes the material of conductor layer 32 from areas that are not masked by the etch mask. In that regard, the nanofibers 28 and electrode 26 are specifically masked during the etching process by the etch mask.

An interlayer dielectric layer 38 is deposited and planarized using chemical-mechanical polishing (CMP) to eliminate topography. In an embodiment, the interlayer dielectric layer 38 may be composed of an electrical insulator, such as silicon dioxide. The interlayer dielectric layer 38 is patterned by lithography and etching processes to form via openings and trenches arranged above the via openings as part of a dual damascene process. Wiring features 40 are formed inside trenches patterned in the interlayer dielectric layer 38, and vias 42, 44, 46 are respectively formed inside via openings patterned in the interlayer dielectric layer 38 to provide a routing or metallization level 45 over the metallization level 10. The wiring features 40 and vias 42, 44, 46 may be composed of a metal, such as copper or aluminum, and additional liner and barrier layers (e.g., tantalum nitride or titanium nitride) also present. The metal constituting the wiring feature 40 and vias 42, 44, 46 may be deposited by an electrochemical deposition process, such as electroplating or electroless plating.

A chemical-mechanical polishing (CMP) process may be used to remove excess barrier/liner material and metal from the top surface of interlayer dielectric layer 38 and to planarize the wiring features 40 to be flush with the top surface of interlayer dielectric layer 38. The via 42 electrically and physically connects one of the wiring features 40 with the wiring feature 14. The via 44 electrically and physically connects the electrode 26 of the MIM capacitor with another of the wiring features 40. The via 46 electrically and physically connects the electrode 36 of the MIM capacitor with yet another of the wiring features 40.

The nanofibers 28 increase the effective area of the electrode 26 and provide a three-dimensional structure as a template for the formation of the electrode 36, which also increases the effective area of the electrode 36. The construction of the MIM capacitor is non-planar in that the nanofibers 28 and the electrode 36 are integrated non-planar features.

Figure 6:
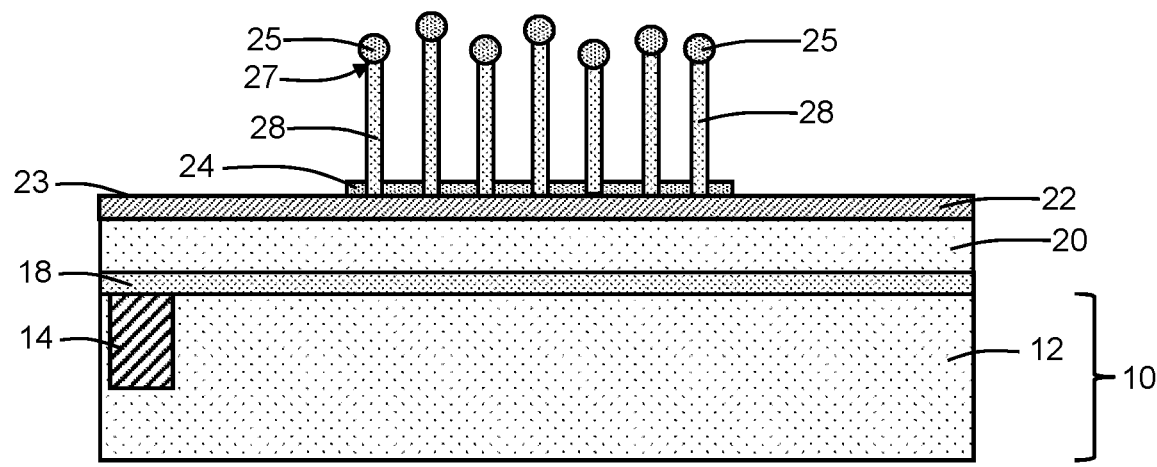
FIGS. 6-9 are cross-sectional views of a structure at successive fabrication stages of a processing method for fabricating a MIM capacitor in accordance with alternative embodiments of the invention.

With reference to FIG. 6 in which like reference numerals refer to like features in FIG. 1 and in accordance with alternative embodiments of the invention, the process flow may be modified to produce nanofibers 28 characterized by more uniform heights instead of a distribution of different heights. To that end, the nanofibers 28 may be grown from the catalyst layer 24, as previously described, before the conductor layer 22 is patterned.

Figure 7:
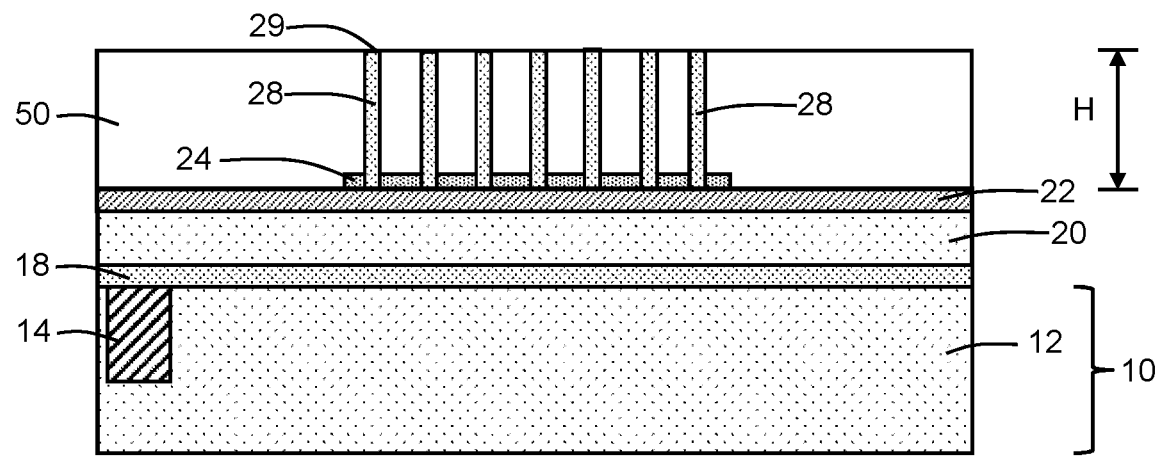

With reference to FIG. 7 in which like reference numerals refer to like features in FIG. 6 and at a subsequent fabrication stage, a dielectric layer 50 may be deposited over the nanofibers 28 and the sections 25 of the catalyst layer 24, and then planarized by chemical-mechanical polishing. The dielectric layer 50 may be composed of silicon dioxide deposited by chemical vapor deposition. Although not shown, the filling of the gaps between the nanofibers 28 may be incomplete because the dielectric layer 50 is sacrificial and the tip portions 27 are present during the deposition of the dielectric layer 50. The planarization removes the sections 25 of the catalyst layer 24 and provides the nanofibers 28 with uniform or substantially uniform heights, H, at the terminating ends 29 that are exposed after the enlarged tip portions 27 are removed. The height of the nanofibers 28 may equal or substantially equal to the polished thickness of the dielectric layer 50. Planarization is applied for the removal of the sections 25 of the catalyst layer 24 instead of a wet chemical etching process.

Figure 8:
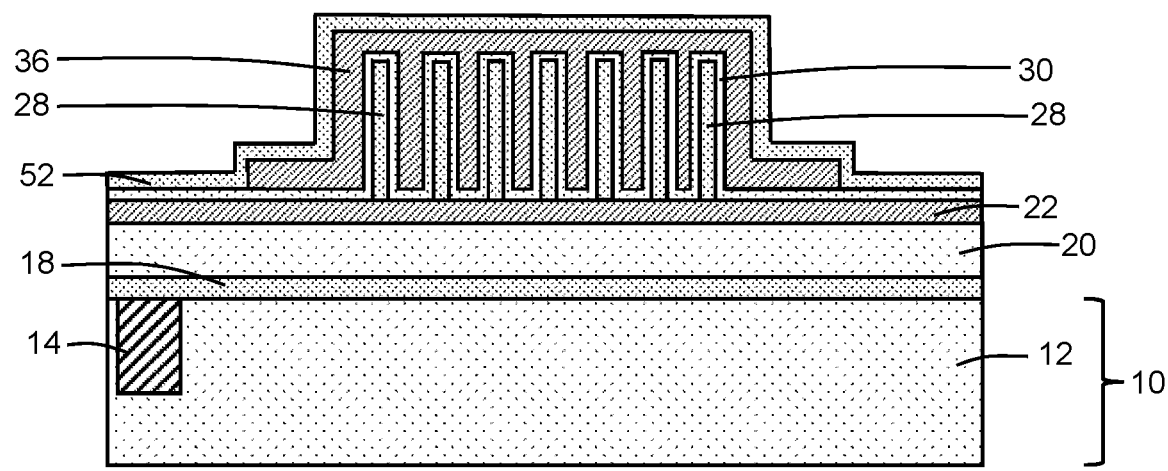

With reference to FIG. 8 in which like reference numerals refer to like features in FIG. 7 and at a subsequent fabrication stage, the dielectric layer 50 is removed by etching with a wet chemical etching process using a diluted acid, followed by a rinse with deionized water. The dielectric layer 30 and conductor layer 32 are then deposited as previously described, and the conductor layer 32 is patterned to define the electrode 36. Because of the planarization of the nanofibers 28, the topography of the electrode 36 formed over the nanofibers 28 is minimized. A capping layer 52 composed of a dielectric material, such as silicon nitride, may be deposited by chemical vapor deposition over the dielectric layer 50.

Figure 9:
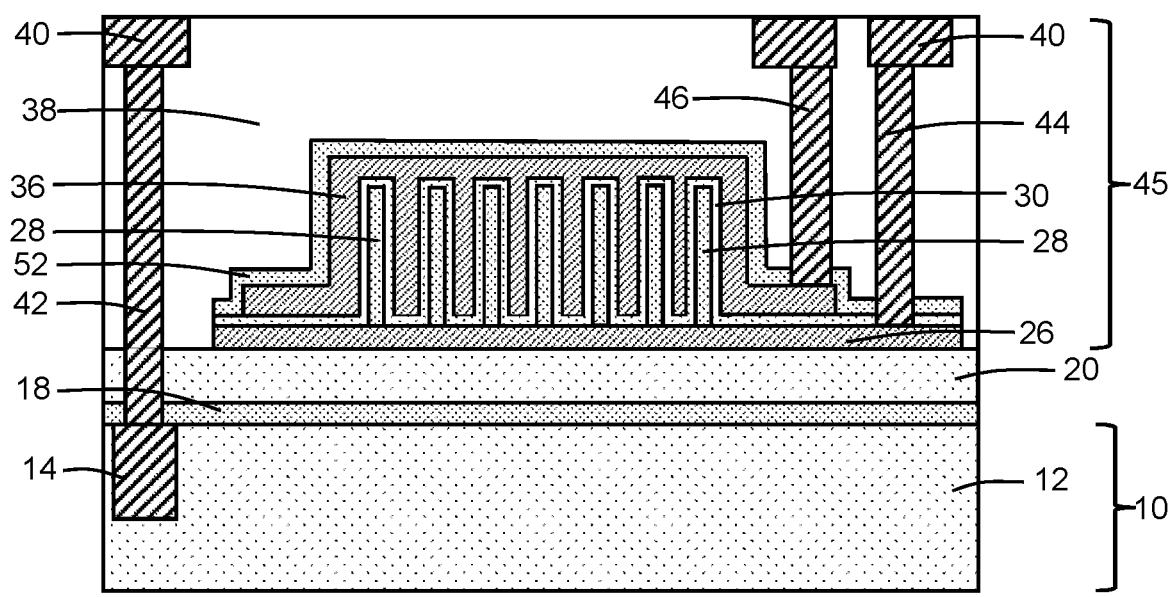

With reference to FIG. 9 in which like reference numerals refer to like features in FIG. 8 and at a subsequent fabrication stage, the capping layer 52 and the conductor layer 22 are patterned with an etching process to form the electrode 26. The interlayer dielectric layer 38 is deposited, and the wiring features 40 and vias 42, 44, 46 are formed, as previously described, in the interlayer dielectric layer 38.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming a plurality of conductive nanofibers on a surface of a first conductor layer, wherein the plurality of conductive nanofibers are laterally spaced by gaps, and each of the plurality of conductive nanofibers is terminated by an enlarged tip portion opposite the surface of the first conductor layer;
    removing the enlarged tip portion from each of the plurality of conductive nanofibers;
    depositing a conformal dielectric layer on the first conductor layer and the plurality of conductive nanofibers after the enlarged tip portion is removed from each of the plurality of conductive nanofibers;
    depositing a second conductor layer over the conformal dielectric layer on the first conductor layer and the plurality of conductive nanofibers that fills the gaps between the plurality of conductive nanofibers to define a solid composite layer; and
    patterning the second conductor layer with lithography and etching processes.

2. The method of claim 1 wherein forming the plurality of conductive nanofibers on the surface of the first conductor layer comprises:
    forming a patterned catalyst layer on the first conductor layer,
    wherein the plurality of conductive nanofibers are grown from the patterned catalyst layer, and the enlarged tip portion terminating each of the plurality of conductive nanofibers includes a section of the patterned catalyst layer removed during growth.

3. The method of claim 1 wherein the second conductor layer includes a first portion conformally deposited by atomic layer deposition and a second portion deposited by physical vapor deposition.

4. The method of claim 1 wherein removing the enlarged tip portion from each of the plurality of conductive nanofibers comprises:
   depositing a dielectric layer over the plurality of conductive nanofibers and the first conductor layer; and
   planarizing the dielectric layer and the plurality of conductive nanofibers,
   wherein the enlarged tip portion is removed from each of the plurality of conductive nanofibers when the dielectric layer and the plurality of conductive nanofibers are planarized.

5. The method of claim 4 wherein each of the plurality of conductive nanofibers has a terminating end exposed after removing the enlarged tip portion, and the plurality of conductive nanofibers have approximately equal heights between the surface of the first conductor layer and the respective terminating end.

6. The method of claim 1 wherein the enlarged tip portion is removed from each of the plurality of conductive nanofibers with a wet chemical etching process.

7. The method of claim 6 wherein each of the plurality of conductive nanofibers has a terminating end exposed after removing the enlarged tip portion, and the plurality of conductive nanofibers have unequal heights between the surface of the first conductor layer and the respective terminating end.

8. A method of forming a metal-insulator capacitor, the method comprising:
   forming a plurality of conductive nanofibers on a surface of a first conductor layer, wherein the plurality of conductive nanofibers are laterally spaced by gaps, and each of the plurality of conductive nanofibers is terminated by an enlarged tip portion opposite the surface of the first conductor layer;
   removing the enlarged tip portion from each of the plurality of conductive nanofibers;
   depositing a conformal dielectric layer on the first conductor layer and the plurality of conductive nanofibers after the enlarged tip portion is removed from each of the plurality of conductive nanofibers;
   depositing a second conductor layer over the conformal dielectric layer by a deposition process combination that fills the gaps between the plurality of conductive nanofibers to define a solid composite layer; and
   patterning the second conductor layer to define a first electrode of the metal-insulator capacitor.

9. The method of claim 8 wherein each of the plurality of conductive nanofibers has a terminating end that is exposed after removing the enlarged tip portion, and the plurality of conductive nanofibers have approximately equal heights between the surface of the first conductor layer and the terminating end of each of the plurality of conductive nanofibers.

10. The method of claim 8 wherein the second conductor layer includes a first portion conformally deposited by atomic layer deposition and a second portion deposited by physical vapor deposition.

11. The method of claim 8 further comprising:
   patterning the first conductor layer to define a second electrode of the metal-insulator capacitor.

12. The method of claim 8 wherein forming the plurality of conductive nanofibers on the surface of the first conductor layer comprises:
   forming a patterned catalyst layer on the first conductor layer,
   wherein the plurality of conductive nanofibers are grown from the patterned catalyst layer, and the enlarged tip portion terminating each of the plurality of conductive nanofibers includes a section of the patterned catalyst layer removed during growth.

13. The method of claim 12 wherein the section of the patterned catalyst layer is removed from each of the plurality of conductive nanofibers and the patterned catalyst layer is removed from the first conductor layer with a wet chemical etching process.

14. The method of claim 8 wherein the enlarged tip portion is removed from each of the plurality of conductive nanofibers with a wet chemical etching process.

15. The method of claim 14 wherein each of the plurality of conductive nanofibers has a terminating end exposed after removing the enlarged tip portion.

16. The method of claim 15 wherein the plurality of conductive nanofibers have unequal heights between the surface of the first conductor layer and the respective terminating end.

17. The method of claim 8 wherein removing the enlarged tip portion from each of the plurality of conductive nanofibers comprises:
   depositing a dielectric layer over the plurality of conductive nanofibers and the first conductor layer; and
   planarizing the dielectric layer and the plurality of conductive nanofibers,
   wherein the enlarged tip portion is removed from each of the plurality of conductive nanofibers when the dielectric layer and the plurality of conductive nanofibers are planarized.

18. The method of claim 17 wherein the dielectric layer and the plurality of conductive nanofibers are planarized by chemical-mechanical polishing.

19. The method of claim 17 wherein each of the plurality of conductive nanofibers has a terminating end exposed after removing the enlarged tip portion.

20. The method of claim 19 wherein the plurality of conductive nanofibers have approximately equal heights between the surface of the first conductor layer and the respective terminating end.

* * * * *